United States Patent [19]

De La Moneda

[11] 3,958,323

[45] May 25, 1976

[54] THREE MASK SELF ALIGNED IGFET FABRICATION PROCESS

[75] Inventor: Francisco H. De La Moneda, Reston, Va.

[73] Assignee: International Business Machines Corporation, Armonk, N.Y.

[22] Filed: Apr. 29, 1975

[21] Appl. No.: 572,805

[52] U.S. Cl. .................................. 29/571; 29/578; 357/59
[51] Int. Cl.² ........................................ B01J 17/00
[58] Field of Search .............. 29/571, 578; 357/59, 357/23

[56] References Cited
UNITED STATES PATENTS

| | | | |
|---|---|---|---|
| 3,673,471 | 6/1972 | Klein | 29/571 |
| 3,711,753 | 1/1973 | Brand | 357/59 |
| 3,761,327 | 9/1973 | Harlow | 357/59 |
| 3,837,071 | 9/1974 | Ronen | 29/571 |
| 3,913,211 | 10/1975 | Seeds | 29/571 |

*Primary Examiner*—W. Tupman
*Attorney, Agent, or Firm*—John E. Hoel

[57] ABSTRACT

A process is disclosed for making a self-aligned IGFET having a polycrystalline silicon gate, using three masking steps. Layers of silicon dioxide, polycrystalline silicon, and silicon nitride are respectively deposited on the surface of a silicon substrate of a first conductivity type. With the first mask, openings are made in regions of these layers above the proposed location for the source and drain. The source and drain are then deposited in the substrate through these openings. The disclosed process continues, growing a silicon dioxide layer on the lateral surfaces of the polysilicon gate, exposed by these openings. Then a silicon nitride layer is deposited on all exposed surfaces and a second mask is employed to permit the removal by etching of this nitride layer from all portions except the proposed location of devices metallization at a first region over the gate, a second region over the source and a third region over the drain of the device. The polycrystalline silicon layer is then etched and removed from the field region of the device. Polysilicon material in the gate region is protected during this etching stop by the first nitride layer and the silicon dioxide layer grown over the lateral exposed surfaces of the gate. The nitride layer regions are then etched away and metallized contacts are formed to the source, drain and polycrystalline silicon gate regions by means of a third and last mask. Alternative steps are disclosed for making the gate and field oxide regions coplanar.

37 Claims, 17 Drawing Figures

THREE MASK SELF ALIGNED IGFET FABRICATION PROCESS

BACKGROUND OF THE INVENTION

Improvements of circuit performance in the IGFET technology are readily achieved by reducing both horizontal and vertical geometry. Advantages due to reductions of horizontal dimensions are sometimes negated by the mask tolerances needed in order to insure corrective alignment between consecutive masking steps. Consequently, it is desirable to use processes with self-alignment features and a minimum number of masking steps. Reducing the number of masking steps also improves yields and cuts down manufacturing costs.

The prior art has disclosed a three mask self-aligned process for making an IGFET in C. C. Mai, et al., Three Mask Self-Aligned MOS Technology, *IEEE Transactions on Electron Devices*, ED-20, December 1973, pages 1162–1163. The reference disclosed a three mask MOS process using an aluminum gate. This process produces a device having the disadvantage that the aluminum gate does not cover the thin oxide layer overlapping the source and drain diffusions. Experience has shown that a mere misalignment of a metal gate with respect to the oxide taper in the gate region can reduce the product reliability by a factor of ten. However in the case of the device produced by the process disclosed in the C. C. Mai, et al. reference, it is not really a question of misalignment but of no thin oxide coverage at all. The reliability of the device produced by the referenced process would be objectionable in any long term application. Ionic contamination of the gate region would be the failure mode.

Existing processes for producing polycrystalline silicon gate, IGFET devices are typified by M. Faggin, et al., "Silicon Gate Technology", *Solid State Electronics*, Vol. 13, 1970, Pgs. 1125–1144. Faggin, et al., shows a four mask process with a first mask defining the field region, the second mask defining a polycrystalline silicon gate, source and drain regions, the third mask to open windows for source, drain contacts, and a fourth mask defining the metallized contact to the device. Since each mask introduces an additional horizontal tolerance in the position of the elements of the device, the corresponding production yield of a four mask process is highly sensitive to the precision with which the successive masks are mutually aligned. A reduction in the number of masks would improve the production yield of the resulting product.

OBJECTS OF THE INVENTION

It is an object of the invention to produce a self-aligned IGFET device having a high product reliability, with three masking steps.

It is a further object of the invention to produce a self-aligned IGFET device having an hermetically sealed gate region.

It is still another object of the invention to produce an IGFET device with a high production yield.

SUMMARY OF THE INVENTION

These and other objects of the invention are accomplished by the three mask, self-aligned IGFET fabrication process disclosed herein. Layers of silicon dioxide, polycrystalline silicon and silicon nitride are respectively deposited on the surface of a silicon substrate of a first conductivity type. Openings over the proposed location for the source and drain regions of the wafer are made with the aid of a first photolithographic mask. The source and drain are then deposited in the substrate through these openings. In the process disclosed herein, a layer of silicon dioxide is grown on the exposed lateral surfaces of the polycrystalline silicon gate region and on the exposed silicon surface at the bottom of the source and drain openings. Next, a layer of silicon nitride is deposited on all exposed surfaces. With the aid of a second photolithographic mask, the silicon nitride layer is etched leading to a first nitride protection barrier over the gate region, a second nitride protective barrier over the source region and a third nitride protective barrier over the drain region. The polycrystalline silicon layer is then etched from the field region. The nitride protective barrier over the polycrystalline siilicon gate region and the silicon dioxide layer covering the laterial and otherwise exposed surfaces of the polycrystalline silicon gate region serving to protect the polycrystalline silicon gate from being etched during the subsequent etching process for the removal of the polycrystalline silicon in the field region. This structure also serves to hermetically seal the gate structure from contaminants during subsequent proceeding and in the finished device. Subsequently, the nitride protective barriers over the gate, source and drain regions are etched away and, with the aid of a third photolithographic mask, ohmic contacts are formed to the polycrystalline silicon gate, source, and drain regions. The gate region of the resulting device has an enhanced hermeticity produced by the silicon dioxide layer covering the lateral surfaces and the metal contact covering the top surface of the polycrystalline gate region. The three mask process results in a high production yield for the device because of the reduction in the cummulative tolerances for the alignment of the masks necessary to produce the device. An alternative step of oxidizing a selected fractional thickness of the polycrystalline silicon in the field region produces coplanarity of the field oxide with the gate.

DESCRIPTION OF THE DRAWINGS

The foregoing and other objects, features and advantages of invention will be apparent from the following or particular description of the preferred embodiments of the invention, as illustrated in the accompanying drawings.

DISCUSSION OF THE PREFERRED EMBODIMENT:

Described is a high yield, three mask process for fabricating an insulated gate field effect transistor (IGFET) device whose gate region is hermetically sealed.

Figure 1:
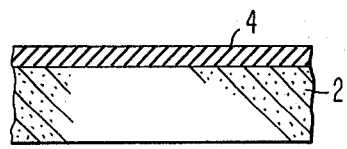
FIG. 1 shows the first step of growing the gate oxide layer on the substrate.

FIG. 1 illustrates the first step in the process. One starts with a silicon substrate having a first conductivity type doping. The doping should be P type if N channel devices are to be formed or N type if P channel devices are to be formed. The disclosure herein will be directed to the production of N channel devices, however it is recognized that by the well known substitution of obvious dopant types, P-channel devices could be made. The substrate 2 is doped with P-type dopant such as Boron for example, at a concentration of $8 \times 10^{15}$ CM$^{-3}$. FIG. 1 illustrates the step of growing a layer of silicon dioxide having a thickness of between 500 and 700 A on the surface of the silicon substrate 2. This oxide layer will serve as the insulation layer separating the channel region in the silicon substrate of the resulting device from the gate conductive layer. The process by which the silicon dioxide layer 4 is grown is thermal oxidation.

Figure 2:
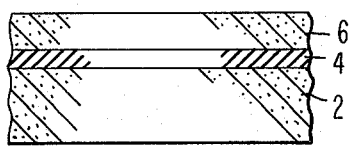
FIG. 2 shows the step of depositing polycrystalline silicon layer on the silicon dioxide layer.

FIG. 2 illustrates the second step in the inventive process of depositing a layer of polycrystalline silicon 6 which will serve as the gate electrode in the finished IGFET device. The latter 6 can be grown by processes such as decomposition of silane or sputtering silicon to a thickness of approximately 3,000A.

Figure 3:
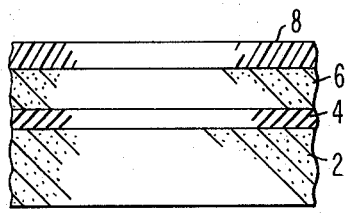
FIG. 3 shows a step of depositing the silicon nitride layer on top of the polycrystalline silicon layer.

FIG. 3 illustrates the step of depositing a silicon nitride layer 8 on the surface of the polycrystalline silicon layer 6. The silicon nitride layer 8 will mask the polycrystalline silicon layer during subsequent silicon oxide etching steps. The silicon nitride layer 8 is deposited by sputtering or chemical vapor deposition (CVD) to a thickness of approximately 1,000A.

Figure 4:
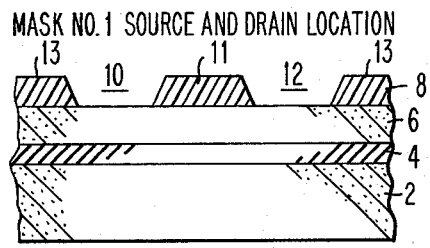
FIG. 4 shows the first photolithographic masking step for etching holes in the silicon nitride layer in a pattern for the source and drain.

FIG. 4 illustrates the result of the first photolithographic masking step wherein regions which will ultimately become the location of the source and drain of the resulting IGFET device, are delineated. By conventional photolithographic processes, a layer of photoresist is coated over the silicon nitride layer 8, the silicon wafer is brought into juxtaposition with a photolithographic mask having the desired pattern for the source and drain regions thereon, by projection or contact printing, the pattern is transferred to the photoresist layer, the photoresist layer is developed and treated so that the portion overlaying the source and drain regions to be defined, is removed thereby exposing the silicon nitride surface. A suitable etching solution such as warm phosphoric acid is employed to etch away the source and drain openings 10 and 12 in the silicon nitride layer 8.

Figure 5:
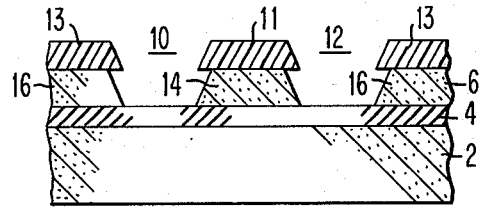
FIG. 5 shows the step of dip etching to remove the polycrystalline silicon layer from the proposed source and drain regions.

FIG. 5 illustrates the next step of dip etching to remove the portion of the polycrystalline silicon layer 6 located below the source and drain openings 10 and 12 in the silicon nitride layer 8. A suitable dip etching solution could be for example a solution containing hydroflouric and nitric acid such as disclosed by D. L. Klein, et al., *J. Electrochem. Soc* 109, 37 (1962) and as employed by Faggin in his publication, Supra, which selectively etches the polycrystalline silicon to the exclusion of the silicon nitride layer 8 which serves as an etching mask for the gate region 14 and the field region 16 of the polycrystalline silicon layer 6.

Figure 6:
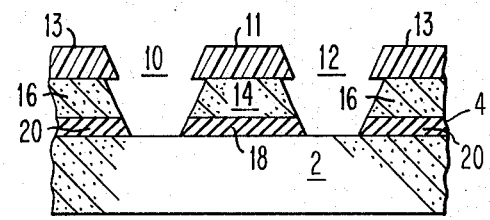
FIG. 6 shows the step of dip etching to remove the silicon dioxide layer over the proposed source and drain regions.

FIG. 6 illustrates the sixth step of dip etching to remove the portion of the silicon dioxide layer 4 exposed through the source and drain openings 10 and 12. A suitable etching solution would be for example buffered hydrofluoric acid which selectively etches the silicon dioxide layer 4 to the exclusion of the polycrystalline silicon layer 6 and the silicon nitride layer 8. The polycrystalline gate region 14 served to mask and delineate insulator region 18 of the silicon dioxide layer 4.

Figure 7:
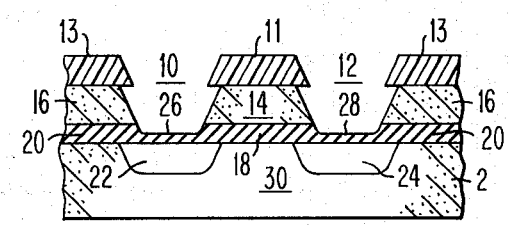
FIG. 7 shows the step of diffusing the source and drain regions into the substrate through the etched openings.

FIG. 7 illustrates the seventh step of forming the source 22 and drain 24 regions in the substrate 2. Conventional processes such as $P_2O_5$ predeposition followed by a drive in or conventional ion-implantation processes can be used to form the source and drain regions 22 and 24 which must have a conductivity type doping opposite to that of the substrate 2. In the case of a particular N-channel device described, N type dopants such as P or As are deposited at a concentration of $10^{20}$ atoms/Cm$^3$depth of approximately $0.2\mu$. In particular, FIG. 7 illustrates the result of employing a $P_2O_5$ predeposition and thermal drive-in technique which results in a lateral diffusion of the source and drain regions 22 and 24 underneath the gate insulator 18 for a distance 80% of the junction depth and the growth of a thin layer silicon dioxide 26 and 28 over the exposed silicon surface of the source and drain regions 22 and 24 respectively. It is to be noted that whether the deposition technique for the source and drain regions is one of thermal diffusion or ion-implantation, the composite structure in the gate region comprising the silicon nitride layer 11, the polycrystalline silicon gate region 14, and the silicon dioxide gate insulator 18 serve to mask the channel region 30 in the substrate 2 from the penetration of dopant atoms which are employed in the formation of the source and drain regions 22 and 24 respectively. The self-alignment of the source and drain regions 22 and 24 with respect to the gate region 14 eliminates the adverse effect of the misalignment of sequential masks on the product yield of the process and the resultant electrical performance of the device.

Figure 8:
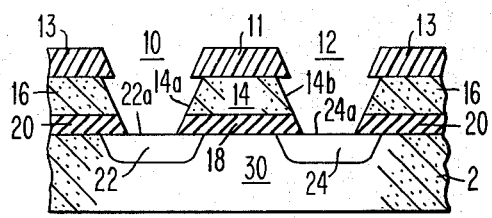
FIG. 8 shows the step of dip etching to remove the oxide growth during the diffusion of FIG. 7.

FIG. 8 illustrates the eighth step of dip etching to remove the silicon dioxide layers 26 and 28 formed over the exposed silicon surfaces of the source and drain regions 22 and 24 respectively during the previous step. A suitable etching solution for the dip etch is buffered hydroflouric acid.

Figure 9:
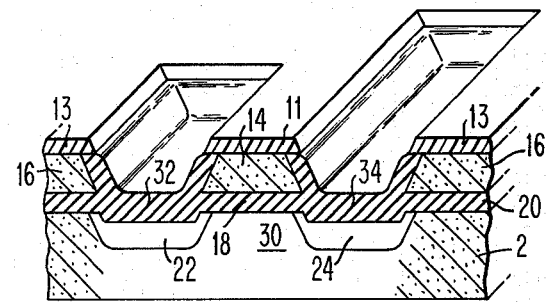
FIG. 9 shows the step of growing silicon dioxide over the exposed silicon in the source and drain regions and on the exposed sidewall surfaces of the polycrystalline silicon gate.

FIG. 9 illustrates the ninth step of the growth of a thin silicon dioxide layer of approximately 1,000A in thickness over the exposed silicon surface 22A of the source region 22, the exposed silicon surface 24A of the drain region 24, the exposed silicon surfaces 14A and 14B on the sidewalls of the polycrystalline silicon gate region 14. Thus, the silicon dioxide layer 32 in opening 10 and the silicon dioxide layer 34 in the opening 12, in combination with the nitride layer 11, hermetically seals and serves to protect the polycrystalline silicon gate region 14 from subsequent errosion during etching steps for the removal of the field region of the polycrystalline silicon layer 16. Protective oxide coatings 32 and 34 also serve to protect the otherwise exposed silicon surface for the source region 22 and drain region 24 during subsequent silicon etching steps. The method by which the protective oxide coating 32 and 34 are formed is thermal growth.

Figure 10:
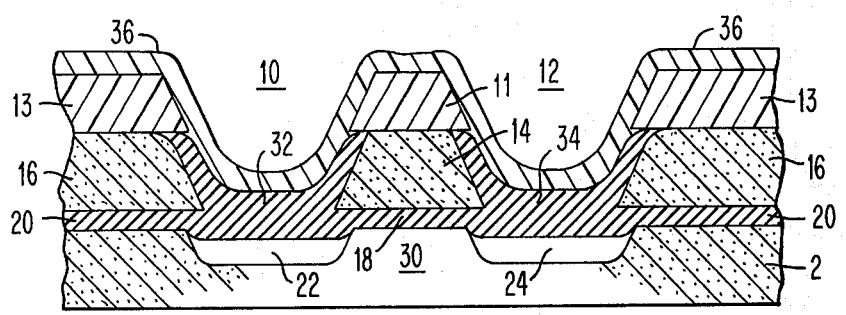
FIG. 10 shows the step of depositing silicon nitride over all exposed surfaces.

FIG. 10 shows step ten wherein a layer of silicon nitride 36 is deposited over all exposed surfaces by the CVD method of sputtering, for example, to a thickness of approximately 500A. The silicon nitride layer 36 will serve as an oxygen impervious layer during a subsequent oxidation step.

Figure 11:
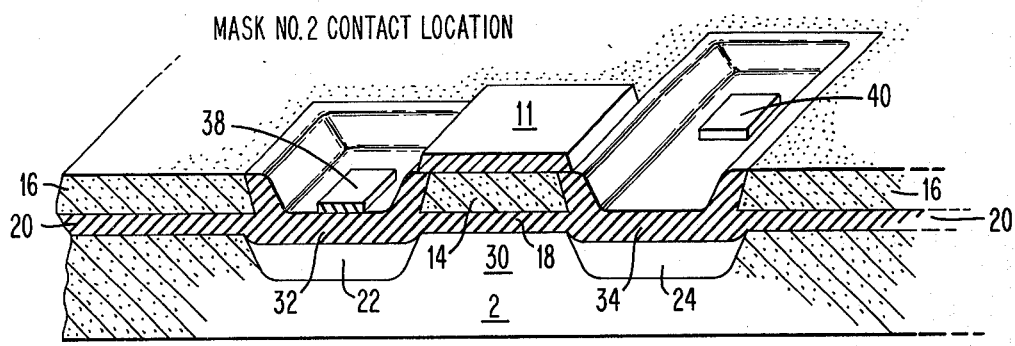
FIG. 11 shows the second photolithographic masking step to permit the etching and removal of the silicon nitride layer forming nitride protective barriers over the source, drain and gate regions.

FIG. 11 illustrates step 11 wherein a second photolithographic mask is employed to define the location of electrical contacts to the source, drain and gate regions, employing conventional photolithographic processing steps such as contact printing. Through the use of the second mask, the silicon nitride regions 11, 38, and 40 are delineated over the gate 14, source 22, and drain 24 regions respectively. For convenience, layer 36 is shown merged with 11.

Figure 12:
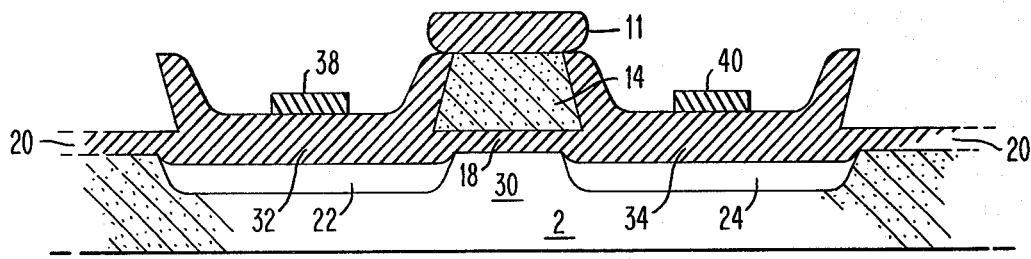
FIG. 12 shows the step of etching the polycrystalline silicon from the field region about the device.

FIG. 12 illustrates step 12 of selectively etching the polycrystalline silicon layer 16 from the field region surrounding the device. As was previously described, the silicon nitride protective layer 11 in combination with the silicon dioxide protective barrier layers 32 and 34, serves to hermetically seal the polycrystalline silicon gate region 14 during a subsequent silicon etching step. The silicon nitride protective barrier layers 38 and 40 over the source and drain regions 22 and 24, respectively, will serve as oxygen impervious layers in a later oxide growth step.

Figure 13:
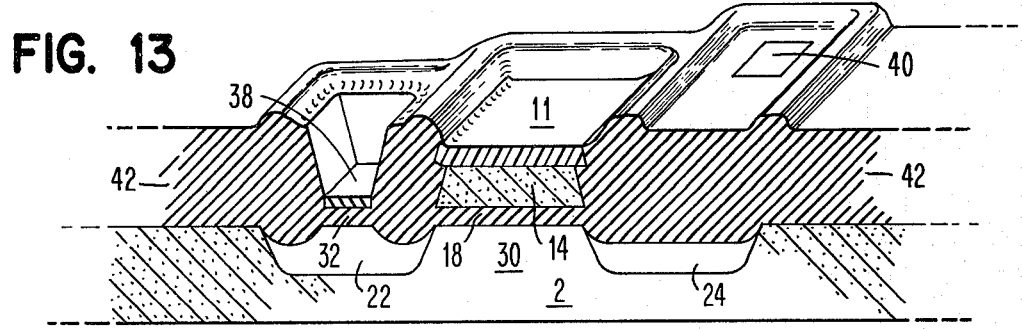
FIG. 13 shows the step of growing the field oxide.

FIG. 13 illustrates the step 13 of growing the field oxide to a thickness of approximately 7,000A by a wet thermal oxidation. The field oxide 42 will grow at the surface of any silicon which is not protected by an oxygen impervious protective layer of silicon nitride, such as protective barrier layers 11, 38, and 40 located over the polycrystalline silicon gate 14, the source 22 and the drain 24, respectively. The use of a silicon nitride protective barrier layer 11 over the polycrystalline silicon gate region 14 for the dual purposes of first hermetically sealing the gate 14 from the etching solution used to remove the polycrystalline silicon layer 16 in the field region in step 12 and secondly, of using it as an oxygen impervious layer to preclude the formation of an oxide layer on the top surface of the gate 14 in the step 13, in combination with the joint deposition of layers 38 and 40, is a principal contribution to the reduction of the number of masking steps necessary to produce the IGFET device.

The thickness of the field oxide layer 42 can be grown to a thickness such that its upper surface is coplanar with the upper surface of the polycrystalline silicon gate 14. Such coplanarity improves the fidelity of the contour of structures produced on the gate 14 and oxide 42 surfaces by photolithographic projection printing.

An alternative step for the growth of the field oxide is as follows. Beginning with the structure of FIG. 11, the polysilicon can be directly oxidized and totally converted to silicon dioxide, as is disclosed in copending applications Ser. No. 521,423 filed Nov. 6, 1974 and assigned to the instant assignee. This results in the growth of the field oxide as shown in FIG. 13.

It should also be recognized that a selected fraction of the total thickness of the polycrystalline silicon layer 16 in FIG. 11 can be etched and the remaining unetched portion of layer 16 can then be totally oxidized to form the field oxide region 42. The fraction of layer 16 removed can be selected to achieve a desired final field oxide thickness, layer 42 in FIG. 13. For example, it may be desirable to make the upper surface of the field oxide layer 42 substantially coplanar with the upper surface gate region 14. To achieve this coplanarity, approximately 60% of the thickness of the polycrystalline silicon layer 16 is etched away and the remaining approximately 40% of layer 16 totally oxidized. The relatively large volume of oxide results in a coplanar device.

Etching a portion of the layer 16 also results in a reduction in the amount of time necessary to form the thermal oxide layer 42 in the field region, thereby minimizing undesired lateral diffusion of the source and drain regions 22 and 24.

The protective barrier layer 11 over the polycrystalline silicon gate 14 must be composed of a material which is both resistant to the erosional effects of the silicon etchant used to remove the polycrystalline silicon field region 16 and is also impervious to the oxygen employed in the growth of the field oxide layer 42. In addition, the layer 11 must also have the ability to mask the polycrystalline silicon gate region 14 during the droping process of step 7. Other materials in addition to silicon nitride, which can be employed as the layer 11, includes $Al_2O_3$.

Figure 14:
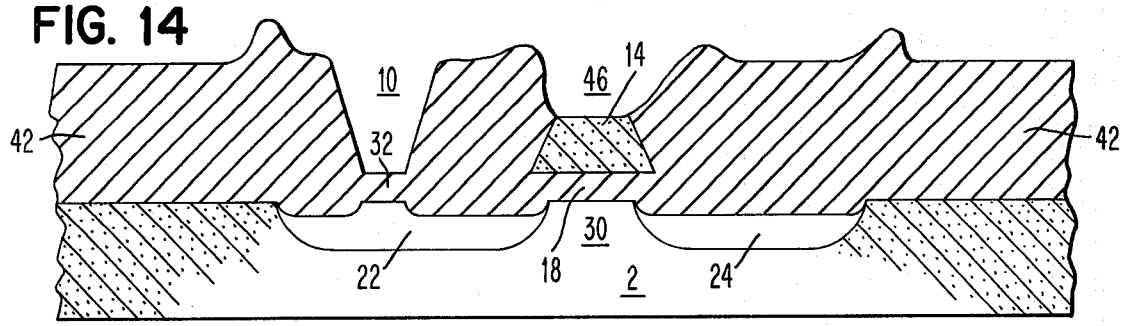
FIG. 14 shows the step of dip etching to remove the nitride protective barrier from the source, drain and gate regions.

FIG. 14 illustrates step 14 of dip etching to remove the silicon nitride layers 36 and 11 on gate region 14 and 38 and 40 over the source and drain regions 22 and 24, respectively. A suitable agent for the silicon nitride removal is warm phosphoric acid.

Figure 15:
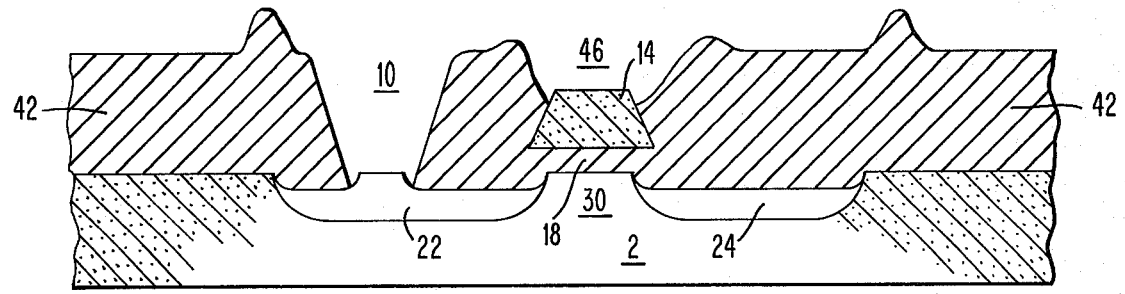
FIG. 15 shows the step of dip etching to remove a residual oxide layer from the source and drain contact region.

FIG. 15 illustrates step 15 which is the dip etching to remove the thin layer of silicon dioxide 32 over the source 22 and the layer 34 over the drain 24. The suitable etchant for this step is buffered HF acid. The thickness of layers 32 and 34 is approximately 1,000A and in view of the fact that the thickness of the field oxide 42 is about 7,000A, there is no necessity for a mask in this step. The removal of the nitride layers 36 and 11 in step 14 exposed the surface of the polycrystalline silicon gate region 14 to permit electrical contact therewith. The removal of the silicon dioxide layers 32 and 34 over the source and drain regions 22 and 24 in step 15 exposes the source and drain for electrical contact.

Figure 16:
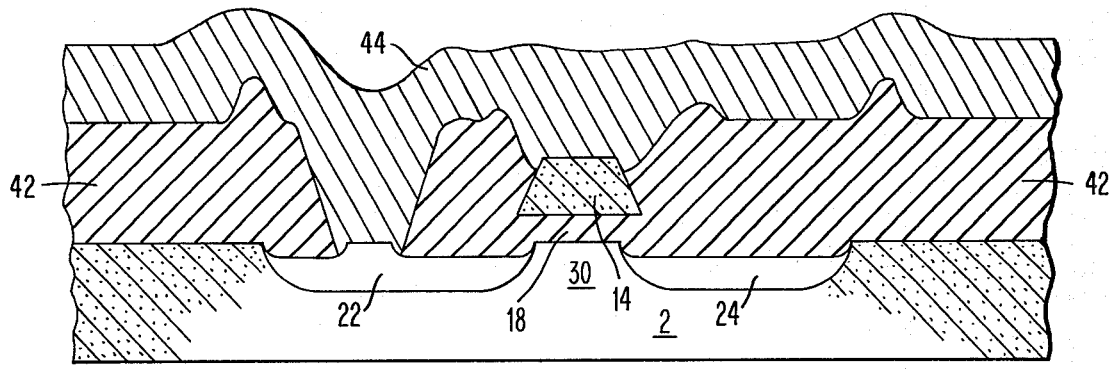
FIG. 16 shows the step of depositing metal over all exposed surfaces.

FIG. 16 illustrates step 16 which is the deposition of the metallization layer 44 over all exposed surfaces. In particular, the metallization layer 44 will make contact through the opening 10 to the source region 22 and will make contact through the opening 12 to the drain region 24. The metallization layer 44 will also make contact with the polycrystalline silicon gate region 14 through the opening 46. The metallization layer 44 is disclosed in its preferred embodiment as aluminum, however the composition of the metallization layer can also be Molybdenum.

Figure 17:
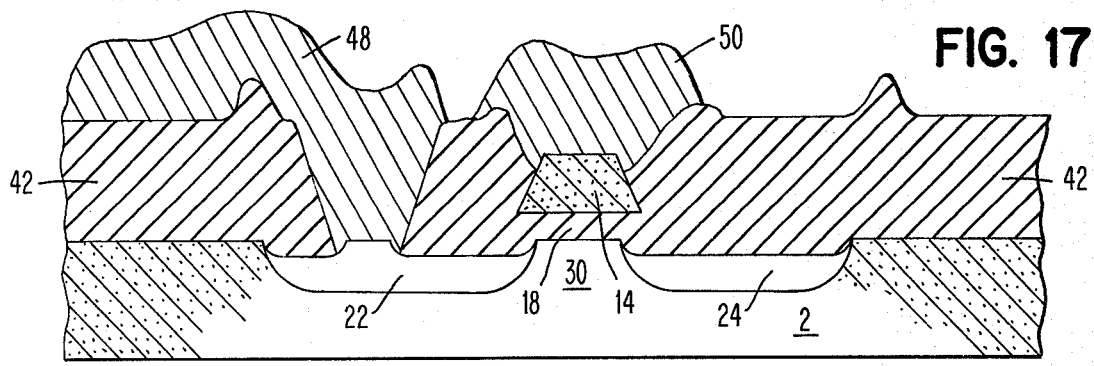
FIG. 17 shows the third and last photolithographic masking step of defining the shape of the metal contact to the source, drain and gate regions.

FIG. 17 illustrates the finished IGFET device after execution of the third and last masking step which, through the use of standard photolithographic masking processes delineates the electrical contacts 48 and 50 to the source 22 and the gate region 14 and also the electrical contact to the drain region 24 for the IGFET device.

Use of the disclosed process in making an insulated gate field effect transistor device results in an increased production yield and a resulting device product having a higher reliability through an increased hermeticity and resistance to ionic contamination in the gate region.

While the invention has been particularly shown and described with reference to the preferred embodiments thereof, it will be understood by those skilled in the art that the foregoing and other changes in form and details may be made therein without departing from the spirit and scope of the invention.

I claim:

1. In a process for making a field effect transistor device having a polycrystalline silicon gate, with a silicon substrate of a first conductivity type having deposited therein source and drain regions of a second conductivity type, with a gate insulator layer, a polycrystalline silicon layer, and an oxygen impervious layer, sequentially formed on the surface of said substrate, with openings in said layers over said source and drain regions, defining a gate region between said source and drain regions and a field region surrounding said source, gate, and drain regions, comprising the steps of:

growing a first silicon dioxide layer region on the exposed surfaces of said polycrystalline silicon layer in said gate region;

etching said oxygen impervious layer, forming a first oxygen impervious region over said gate region and exposing said polycrystalline silicon layer in said field region;

etching said polycrystalline silicon layer in said field region;

said polycrystalline silicon layer in said gate region being protected from etching by said first oxygen impervious region and said first silicon dioxide layer region;

etching to remove said first oxygen impervious region;

forming electrical contacts with said source and drain regions and said polycrystalline silicon gate region;

whereby an hermetically sealed insulated gate field effect transistor device can be made in an improved manner.

2. The process of claim 1 wherein said first oxygen impervious region is composed of silicon nitride.

3. The process of claim 1 wherein said gate insulator layer is composed of silicon dioxide.

4. The process of claim 1 wherein said growing step includes the growth of a second silicon dioxide layer on the exposed silicon surface of said source and drain regions;

whereby said source and drain regions are protected from etching during said etching step for the polycrystalline silicon layer in said field region.

5. The process of claim 1 wherein said step of etching said oxygen impervious layer further comprises:

forming a second and a third oxygen impervious regions over said source and said drain regions, respectively;

and which process further comprises the steps of:

after said step of etching said polycrystalline silicon layer, the step of growing a silicon dioxide layer on the surface of said silicon substrate in regions not covered by said first, second or third oxygen impervious regions;

said step of etching to remove said oxygen impervious region further comprising:

etching to remove said second and said third oxygen impervious regions;

whereby contact holes are formed for said source of drain regions.

6. The process of claim 5 wherein said the first, second, and third oxygen impervious regions are composed of silicon nitride.

7. The process of claim 5 wherein said gate insulator layer is silicon dioxide.

8. The process of claim 5, wherein said step of growing a silicon dioxide layer on the surface of said silicon substrate in regions not covered by said first, second or third oxygen impervious regions further comprises growing the oxide thickness such that its upper surface is coplanar with the upper surface of said polycrystalline silicon layer in said gate region.

9. In a process for making an insulated gate field effect transistor device having a polycrystalline silicon gate, with a silicon substrate of a first conductivity type having deposited therein a source and drain regions of a second conductivity type, with a silicon dioxide gate insulator layer, a polycrystalline silicon layer, and a silicon nitride layer, sequentially formed on the surface of said substrate, openings in said layers defining a gate region between said source and said drain regions and a field region surrounding said source, said gate and said drain regions, comprising the steps of:

growing a first silicon dioxide region on the exposed surfaces of said polycrystalline silicon gate region and a second silicon dioxide region on the exposed silicon surface of said source and drain regions;

depositing a second silicon nitride layer over all exposed surfaces;

etching said first and said second silicon nitride layers to form a first silicon nitride region over said gate region, a second silicon nitride region over said source region, and a third silicon nitride region over said drain region;

etching to remove said polycrystalline silicon layer in said field region;

said polycrystalline silicon layer in said gate region being protected from etching by said first silicon nitride region and said first silicon dioxide region;

etching to remove said first, second, and third silicon nitride regions;

forming electrical contact with said source and drain regions and with said polycrystalline silicon gate regions;

whereby hermetically sealed insulated gate field effect transistor device can be made in an improved manner.

10. In a process for making a field effect transistor device having a polycrystalline silicon gate, with a silicon substrate of a first conductivity type having deposited therein source and drain regions of a second conductivity type, with a gate insulator layer, a polycrystalline silicon layer, and an oxygen impervious layer, sequentially formed on the surface of said substrate, with openings in said layers over said source and drain regions as delineated by a first photolithographic mask, defining a gate region between said source and drain regions and a field region surrounding said source, gate and drain regions, comprising the steps of:

growing a first silicon dioxide layer region on the exposed surfaces of said polycrystalline silicon layer in said gate region;

etching said oxygen impervious layer, forming a first oxygen impervious region over said gate region as delineated by a second photolithographic mask and exposing said polycrystalline silicon layer in said field region;

etching said polycrystalline silicon layer in said field region;

said polycrystalline silicon layer in said gate region being protected from etching by said first oxygen impervious region and said first silicon dioxide layer region;

etching to remove said first oxygen impervious region;

forming electrical contacts with said source and drain regions and said polycrystalline silicon gate region, as delineated by a third photolithographic mask;

whereby an hermetically sealed insulated gate field effect transistor device can be made in a process with three masking steps.

11. The process of claim 10 wherein said first oxygen impervious region is composed of silicon nitride.

12. The process of claim 10 wherein said gate insulator layer is composed of silicon dioxide.

13. The process of claim 10 wherein said growing step includes the growth of a second silicon dioxide layer on the exposed silicon surface of said source and drain regions;

whereby said source and drain regions are protected from etching during said etching step for the polycrystalline silicon layer in said field region.

14. The process of claim 10 wherein said step of etching said oxygen impervious layer further comprises:

forming a second and a third oxygen impervious regions over said source and said drain regions, respectively;

and which process further comprises the steps of:

after said step of etching said polycrystalline silicon layer, the step of growing a silicon dioxide layer on the surface of said silicon substrate in regions not covered by said first, second or third oxygen impervious regions;

said step of etching to remove said oxygen impervious region further comprising:

etching to remove said second and said third oxygen impervious regions;

whereby contact holes are formed for said source of drain regions.

15. The process of claim 14 wherein said the first, second, and third oxygen impervious regions are composed of silicon nitride.

16. The process of claim 14 wherein said gate insulator layer is silicon dioxide.

17. The process of claim 14, wherein said step of growing a silicon dioxide layer on the surface of said silicon substrate in regions not covered by said first, second or third oxygen impervious region further comprises growing the oxide thickness such that its upper surface is coplanar with the upper surface of said polycrystalline silicon layer in said gate region.

18. In a process for making an insulated gate field effect transistor device having a polycrystalline silicon gate, with a silicon substrate of a first conductivity type having deposited therein a source and drain regions of a second conductivity type, with a silicon dioxide gate insulator layer, a polycrystalline silicon layer, and a silicon nitride layer, sequentially formed on the surface of said substrate, openings in said layers as delineated by a first photolithographic mask, defining a gate region between said source and said drain regions and a field region surrounding said source, said gate and said drain regions, comprising the steps of:

growing a first silicon dioxide region on the exposed surfaces of said polycrystalline silicon gate region and a second silicon dioxide region on the exposed silicon surface of said source and drain regions;

depositing a second silicon nitride layer over all exposed surfaces;

etching said first and said second silicon nitride layers to form a first silicon nitride region over said gate region, a second silicon nitride region over said source region, and a third silicon nitride region over said drain region, as delineated by a second photolithographic mask;

etching to remove said polycrystalline silicon layer in said field region;

said polycrystalline silicon layer in said gate region being protected from etching by said first silicon nitride region and said first silicon dioxide region;

etching to remove said first, second, and third silicon nitride regions;

forming electrical contact with said source and drain regions and with said polycrystalline silicon gate regions, as delineated by a third photolithographic mask;

whereby an hermetically sealed insulated gate field effect transistor device can be made with a process having three masking steps.

19. In a process for making a field effect transistor device having a polycrystalline silicon gate, with a silicon substrate of a first conductivity type having deposited therein source and drain regions of a second conductivity type, with a gate insulator layer, a polycrystalline silicon layer, and an oxygen impervious layer, sequentially formed on the surface of said substrate, with openings in said layers over said source and drain regions, defining a gate region between said source and drain regions and a field region surrounding said source, gate, and drain regions, comprising the steps of:

growing a first silicon dioxide layer region on the exposed surfaces of said polycrystalline silicon layer in said gate region;

etching said oxygen impervious layer, forming a first oxygen impervious region over said gate region and exposing said polycrystalline silicon layer in said field region;

oxidizing said polycrystalline silicon layer in said field region to form a field oxide layer;

said polycrystalline silicon layer in said gate region being protected from excessive oxidation by said first oxygen impervious region and said first silicon dioxide layer region;

etching to remove said first oxygen impervious region;

forming electrical contacts with said source and drain regions and said polycrystalline silicon gate region;

whereby an hermetically sealed insulated gate field effect transistor device can be made in an improved manner.

20. The process of claim 19 wherein said first oxygen impervious region is composed of silicon nitride.

21. The process of claim 19 wherein said gate insulator layer is composed of silicon dioxide.

22. The process of claim 19 wherein said growing step includes the growth of a second silicon dioxide layer on the exposed silicon surface of said source and drain regions;
whereby said source and drain regions are protected from etching during said etching step for the polycrystalline silicon layer in said field region.

23. The process of claim 19 wherein said step of etching said oxygen impervious layer further comprises:
forming a second and a third oxygen impervous region over said source and said drain regions, respectively;
said step of oxidizing said polycrystalline silicon in said field region further comprising the growth of an oxide layer on the surface of said silicon substrate in regions not covered by said first, second or third oxygen impervious regions;
said step of etching to remove said oxygen impervious regions further comprising:
etching to remove said second and said third oxygen impervious regions;
whereby contact holes are formed for said source of drain regions.

24. The process of claim 23 wherein said the first, second, and third oxygen impervious regions are composed of silicon nitride.

25. The process of claim 23 wherein said gate insulator layer is silicon dioxide.

26. The process of claim 23 wherein said step of oxidizing said polycrystalline silicon in said field region further comprises growing the oxide thickness such that its upper surface is coplanar with the upper surface of said polycrystalline silicon layer in said gate region.

27. In a process for making an insulated gate field effect transistor device having a polycrystalline silicone gate, with a silicon substrate of a first conductivity type having deposited therein a source and drain regions of a second conductivity type, with a silicon dioxide gate insulator layer, a polycrystalline silicon layer, and a silicon nitride layer, sequentially formed on the surface of said substrate, openings in said layers defining a gate region between said source and said drain regions and a field region surrounding said source, said gate and said drain regions, compprising the steps of:
growing a first silicon dioxide region on the exposed surface of said polycrystalline silicon gate region and a second silicon dioxide region on the exposed silicon surface of said source and drain regions;
depositing a second silicon nitride layer over all exposed surfaces;
etching said first and said second silicon nitride layers to form a first silicon nitride region over said gate region, a second silicon nitride region over said source region, and a third silicon nitride region over said drain region;
oxidizing said polycrystalline silicon layer in said field region to form a field oxide layer;
said polycrystalline silicon layer in said gate region being protected from etching by said first silicon nitride region and said first silicon dioxide region;
etching to remove said first, second, and third silicon nitride regions;
forming electrical contact with said source and drain regions and with said polycrystalline silicon gate regions;
whereby an hermetically sealed insulated gate field effect transistor device can be made in an improved manner.

28. In a process for making a field effect transistor device having a polycrystalline silicon gate, with a silicon substrate of a first conductivity type having deposited therein source and drain regions of a second conductivity type, with a gate insulator layer, a polycrystalline silicon layer, and an oxygen impervious layer, sequentially formed on the surface of said substrate, with openings in said layers over said source and drain regions, defining a gate region between said source and drain regions and a field region surrounding said source, gate, and drain regions, comprising the steps of:
growing a first silicon dioxide layer region on the exposed surfaces of said polycrystalline silicon layer in said gate region;
etching said oxygen impervious layer, forming a first oxygen impervious region over said gate region exposing said polycrystalline silicon layer in said field region;
etching to remove a selected fraction of the thickness of said polycrystalline silicon layer in said field region;
oxidizing the remaining polycrystalline silicon in the field region forming a field oxide layer having a selected thickness;
said polycrystalline silicon layer in said gate region being protected from etching and excessive oxidation by said first oxygen impervious region and said first silicon dioxide layer region;
etching to remove said first oxygen impervious region;
forming electrical contacts with said source and drain regions and said polycrystalline silicon gate region;
whereby an hermetically sealed insulated gate field effect transistor device can be made in an improved manner.

29. The process of claim 28 wherein the selected fractional thickness of said polycrystalline silicon removed from said field region is such that the selected thickness of the field oxide layer resulting from said step of oxidizing makes the upper surface of said field oxide substantially coplanar with the upper surface of said polycrystalline silicon gate.

30. The process of claim 29, wherein said selected fractional thickness of said polycrystalline silicon removed from said field region is approximately 60%.

31. The process of claim 28 wherein said first oxygen impervious region is composed of silicon nitride.

32. The process of claim 28 wherein said gate insulator layer is composed of silicon dioxide.

33. The process of claim 28 wherein said growing step includes the growth of a second silicon dioxide layer on the exposed silicon surface of said source and drain regions;
whereby said source and drain regions are protected from etching during said etching step for the polycrystalline silicon layer in said field region.

34. The process of claim 28 wherein said step of etching said oxygen impervious layer further comprises;

forming a second and a third oxygen impervious region over said source and said drain regions respectively;

said step of oxidizing said polycrystalline silicon in said field region further comprising the growth of an oxide layer on the surface of said silicon substrate in regions not covered by said first, second or third oxygen impervious regions;

said step of etching to remove said oxygen impervious regions further comprising:

etching to remove said second and said third oxygen impervious regions.

35. The process of claim 34 wherein said the first, second, and third oxygen impervious regions are composed of silicon nitride.

36. The process of claim 34 wherein said gate insulator layer is silicon dioxide.

37. In a process for making an insulated gate field effect transistor device having a polycrystalline silicon gate, with a silicon substrate of a first conductivity type having deposited therein a source and drain regions of a second conductivity type, with a silicon dioxide gate insulator layer, a polycrystalline silicon layer, and a silicon nitride layer, sequentially formed on the surface of said substrate, openings in said layers defining a gate region between said source and said drain regions and a field region surrounding said source, said gate and said drain regions, comprising the steps of:

growing a first silicon dioxide region on the exposed surface of said polycrystalline silicon gate region and a second silicon dioxide region on the exposed silicon surface of said source and drain regions;

depositing a second silicon nitride layer over all exposed surfaces;

etching said first and said second silicon nitride layers to form a first silicon nitride region over said gate region, a second silicon nitride region over said source region, and a third silicon nitride region over said drain region;

etching to remove a selected fraction of the thickness of said polycrystalline silicon layer in said field region;

oxidizing the remaining polycrystalline silicon in the field region forming a field oxide having a selected thickness;

said polycrystalline silicon layer in said gate region being protected from etching and excessive oxidation by said first silicon nitride region and said first silicon dioxide region;

etching to remove said first, second, and third silicon nitride regions;

forming electrical contact with said source and drain regions and with said polycrystalline silicon gate regions;

whereby hermetically sealed insulated gate field effect transistor device can be made in an improved manner.

* * * * *